(12) United States Patent
O'Connor

(10) Patent No.: US 6,543,022 B1
(45) Date of Patent: Apr. 1, 2003

(54) METHOD AND APPARATUS TO ENCODE DIGITAL SIGNALS

(75) Inventor: Dennis M. O'Connor, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/449,283

(22) Filed: Nov. 24, 1999

(51) Int. Cl.[7] .............................................. H03M 13/00
(52) U.S. Cl. ........................ 714/752; 714/807; 380/46
(58) Field of Search ............................... 714/779, 739, 714/807, 751, 752, 757, 799, 732; 708/530, 518; 713/200, 201, 202; 711/163, 164; 380/46, 47

(56) References Cited

U.S. PATENT DOCUMENTS

| | | | | |
|---|---|---|---|---|
| 5,361,323 A | * | 11/1994 | Murata et al. .............. | 704/201 |
| 5,422,919 A | * | 6/1995 | Graham ....................... | 375/130 |
| 5,712,863 A | * | 1/1998 | Gray ........................... | 370/506 |
| 5,717,535 A | * | 2/1998 | French et al. ................. | 360/48 |
| 5,745,522 A | * | 4/1998 | Heegard ..................... | 380/268 |
| 6,401,226 B1 | * | 6/2002 | Maeno ........................ | 714/728 |

* cited by examiner

*Primary Examiner*—Christine T. Tu
(74) *Attorney, Agent, or Firm*—Blakely, Sokoloff, Taylor & Zafman LLP

(57) ABSTRACT

A circuit includes terminals to receive data bits and terminals to receive pseudo-random bits. The circuit further includes circuit elements each combining at least one data bit with at least one pseudo-random bit to produce an output signal on an output terminal. The circuit elements are configured into a plurality of rows, each row receiving at least one data bit of the plurality of data bits, at least one but less than all of the pseudo-random bits received by another row of circuit elements, and output signals of circuit elements of another row.

13 Claims, 4 Drawing Sheets

METHOD AND APPARATUS TO ENCODE DIGITAL SIGNALS

BACKGROUND

1. Field

The present invention relates to encoding of digital signals, and more particularly to encoding digital signals for transmission from one location to another.

2. Background Information

In a computer system, information may be stored and transferred in the form of digital binary signals known as bits. Bits may be transferred between hardware components, between software components and between hardware and software components in the computer system. Further, bits may be transferred from the computer system to another computer system by way of an external channel. The external channel may be embodied in numerous ways. For example, the external channel may comprise a coupling to a local area network, or to the Internet. The external channel may comprise a coupling to the public telephone network using a data modem, or a coupling to a cable television network using a cable modem. Alternatively, the external channel may comprise a coupling to a satellite system by way of a satellite transceiver. These are only some of the many possibilities for an external channel. When bits are transferred, they become vulnerable to accidental or intentional alteration during transmission but prior to reception at their destination.

An integrity check value (a binary digital signal comprising a sequence of bits) may be computed for bit sequences which are transferred (hereafter referred to as "data bits"). The integrity check value may be used to determine whether the data bits have been altered during transmission. An integrity check value may be produced by an integrity check operation. The integrity check operation, when performed on differing data bit sequences, may produce different integrity check values. The integrity check operation may be performed by the sender of the data bits and transmitted to the receiver of the data bits. The receiver may then perform the same integrity operation on the data bits and compare it with the integrity check value transmitted by the sender. If the two integrity check values match, it is likely that the data bits were transmitted without alteration.

As digital signals are processed and transferred at ever increasing speeds, the need increases for an integrity check operation which makes available an integrity check value soon after the data bits are transmitted. A need exists for such an operation to be performed in hardware using simple circuits, or in software by way of the execution of instructions on a microprocessor. Furthermore, such an integrity check operation should be flexible enough to accommodate a variable number of data bits and produce an integrity check value with a variable number of bits.

SUMMARY

A circuit includes terminals to receive data bits and terminals to receive pseudo-random bits. The circuit further includes circuit elements each combining at least one data bit with at least one pseudo-random bit to produce an output signal on an output terminal. The circuit elements are configured into a plurality of rows, each row receiving at least one data bit of the plurality of data bits, at least one but less than all of the pseudo-random bits received by another row of circuit elements, and output signals of circuit elements of another row.

BRIEF DESCRIPTION OF THE DRAWINGS

The subject matter regarded as the invention is particularly pointed out and distinctly claimed in the concluding portion of the specification. The invention, however, may be further understood by reference to the following detailed description read with reference to the accompanying drawings.

DETAILED DESCRIPTION

The embodiments described herein are merely illustrative, and one skilled in the art will appreciate that numerous modifications can be made which nonetheless fall within the scope of the present invention.

In accordance with one aspect of the present invention, an integrity check operation comprises applying a sequence of pseudo random bits to encode the data bits to transmit. A pseudo-random bit sequence is a sequence of bits which tends not to comprise predictable patterns. The encoding process may be implemented using circuits, or using a sequence of software instructions executed on a processor, or a combination of the two. An output of this encoding operation is an integrity check value which may be available soon after (potentially within a single clock cycle of) transmission of the last data bit. Of course, the term "data bits" encompasses all forms of signals and is not strictly limited to the "data" portion of a signal. For example, the "data bits" could in fact comprise address signals, error-correction signals, protocol signals, or any of a number of other signals which accompany the transmission of "data".

In one embodiment, the integrity check operation is carried out in a manner which provides "replay protection" to the transmitted data. Replay protection is provided when the two or more identical sequences of data bits result in a different integrity check value. The operation may be scalable to larger numbers of data bits and larger number of pseudo-random bits to provide stronger integrity (e.g. to provide an integrity check value which is less easily forged) to the transmitted data. When an integrity check value is less easily forged, it may be more difficult for a third party to alter the data bits and generate an integrity check value which accounts for the alterations.

Figure 1:
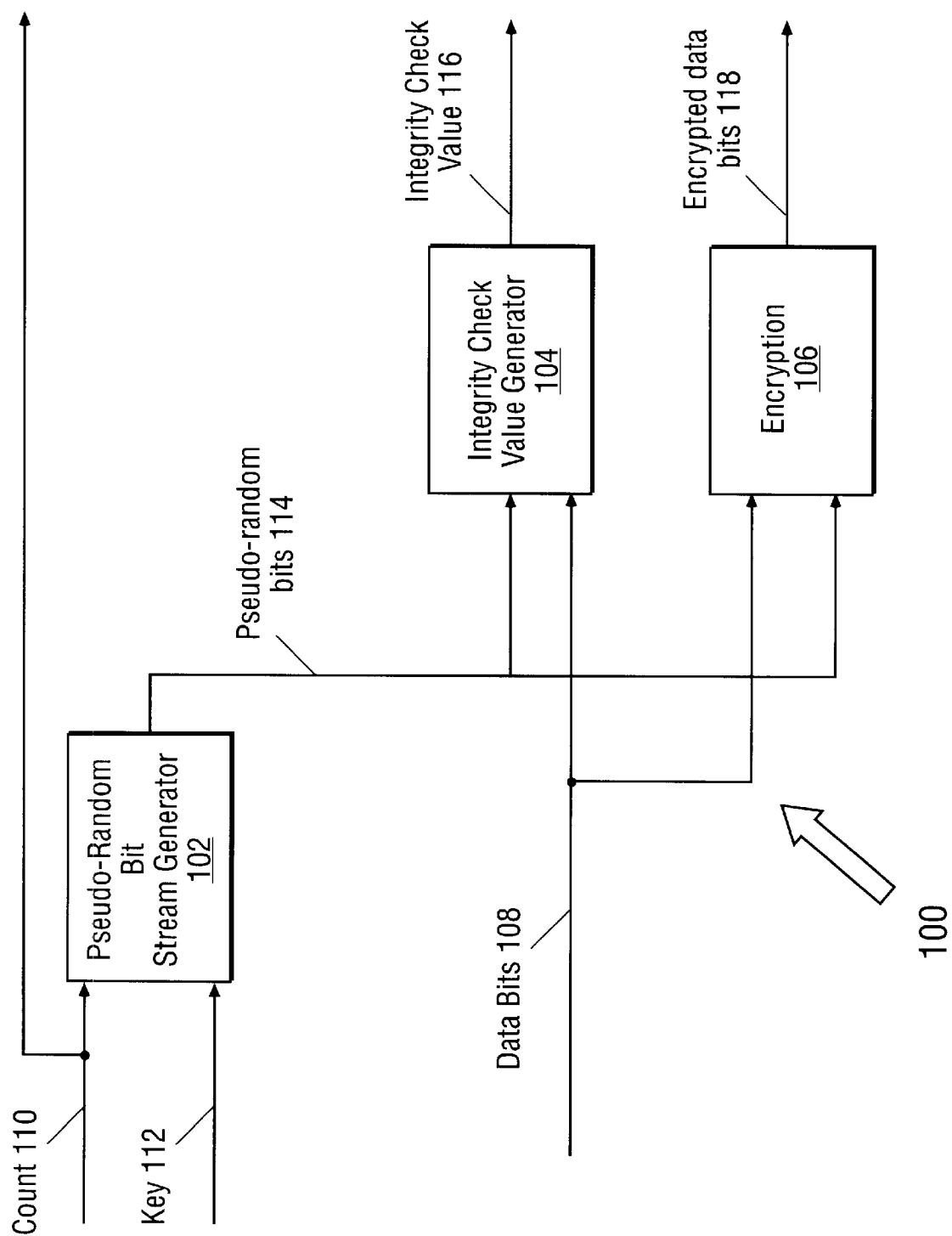
FIG. 1 is a block diagram of an embodiment of a circuit to perform an integrity check operation on data bits in accordance with the present invention.

To provide further confidentiality and additional integrity to the bits to be transferred, the bits may be encrypted. The encryption operation may apply the same pseudo-random bits as are applied for the integrity check operation. For greater security, each of the integrity check operation and the encryption operation could employ preferably disjoint subsets of the pseudo-random bits. FIG. 1 shows an embodiment of a circuit 100 to perform an integrity check operation on data bits 108. The circuit 100 may also encrypt data bits 108 with encryption unit 106. The embodiment comprises a pseudo-random bit generator 102, an integrity check value generator 104, and an encryption unit 106. The pseudo-random bit generator 102 receives a count signal 110 and a signal comprising a "key" 112 which acts as a seed value for the pseudo-random bit generator 102. The pseudo-random bit generator 102 may produce different bit sequences 114 for different key signal 112 inputs. In one embodiment the count signal 110 input to the bit generator 102 is a monotonic sequence (that is, a non-repeating sequence) of signal values which are encoded using the Digital Encryption Standard (DES) operation with the key 112 to produce the pseudo-random bits 114. The nonrepetitive nature of the count signal 110 may help strengthen integrity for the transmitted data bits 108 by increasing the variability of the pseudo-random bits 114.

The pseudo-random bits 114 are supplied to the integrity value generator 104 and optionally to an encryption unit 106. The data bits 108 to transmit are also supplied to the integrity value generator 114 and optionally the encryption unit 106. Once the data bits 108 are encrypted by the encryption unit 106, they are transmitted as encrypted data bits 118. In one embodiment the integrity value 116 produced by the integrity value generator 114 is cumulative. In other words, the integrity value 116 may be used to verify the integrity of all data bits 108 supplied to the integrity value generator 114 subsequent to a reset of the integrity value generator 114.

In one embodiment the integrity value generator 104 is configured to deliver the integrity value 116 shortly after the data bits 108 are supplied, possibly within a single clock cycle. In other words, the integrity value 116 is delivered with low latency after the data bits 108 are supplied. This low-latency configuration is illustrated in greater detail in FIG. 2. Low-latency may be advantageous in high speed data transfer applications such as, for example, high speed data buses internal to computer system, or high speed external channels for transferring data to and from a computer system. A computer system, as defined herein, is any device including a processor capable of executing one or more sequences of instructions to generate signals. Examples of computer systems are personal computers, workstation computers, server computers, hand held computers, and set top boxes, to name just a few examples. When the integrity value 116 is available soon after the data bits 108 are supplied, there may be low latency between when the data bits 108 are transmitted and the transmission of the associated integrity value 116.

Figure 4:
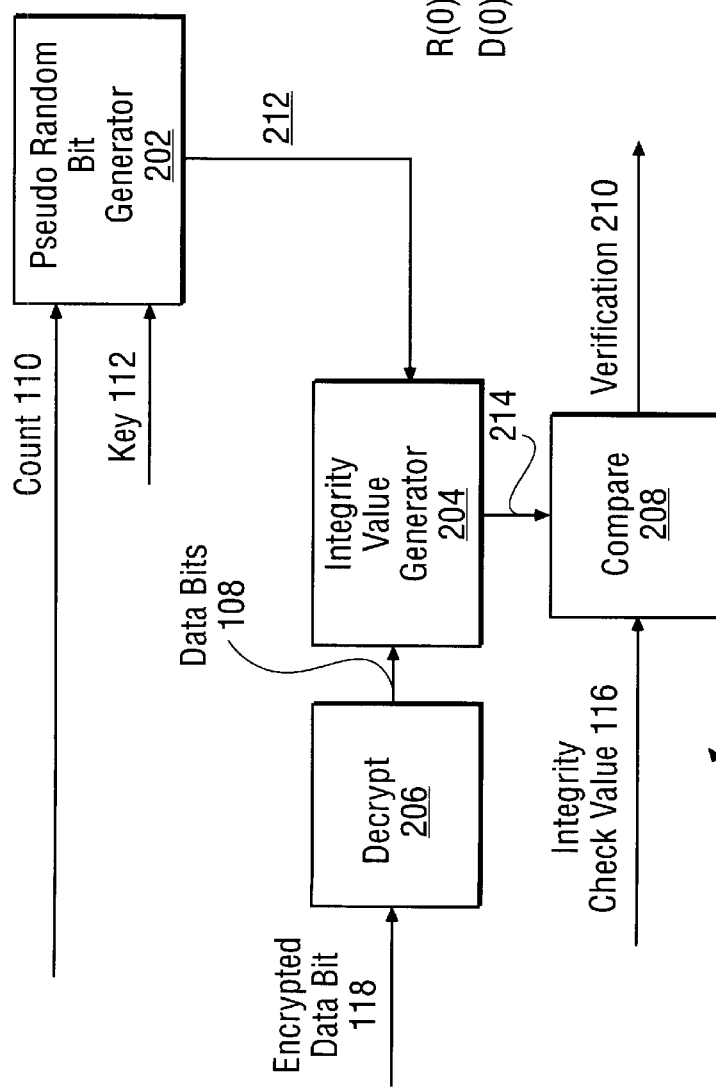
FIG. 4 is a block diagram of one embodiment of a device to receive transmitted data bits in accordance with the present invention.

FIG. 4 is a block diagram showing one embodiment of a device 400 to receive the transmitted data bits 118. Of course, as previously described, the receiver could also be a software sequence. In this embodiment the receiver of the transmitted, encrypted data bits 118 also generates a pseudo random bit sequence 212 using bit generator 202 with the same seed value (key signal 112) as bit generator 102 at the transmitter, for a particular sequence of transmitted bits 118. The key used by both transmitter and receiver may be exchanged between transmitter and receiver using well-known techniques, for example, the well-known Diffie-Helman key exchange technique. Bit generator 202 also uses the same count signal 110 employed by bit generator 102 in the transmitter for a particular sequence of transmitted bits 118. In other words, bit generator 202 at receiver may generate the same pseudo-random bit sequence 212 that was used to generate the integrity check value 116 for a particular sequence of transmitted bits 118.

In one embodiment, the count signal 110 is transmitted from sender to receiver "in the clear", that is, unencrypted. As previously described, by exchanging count signal 110 and using the same key signal 112, the receiver may generate an identical pseudo random bit sequence as the transmitter for a particular sequence of transmitted bits 118. In one embodiment the transmitted, encrypted data bits 118 are decrypted (decryption is, of course, optional) by a decryption unit 206. Un-encrypted data bits 108 are then supplied to integrity check value generator 204, which also receives the pseudo-random bit sequence 212 for that sequence of data bits. An integrity check value 214 is generated and compared with the received integrity check value 116 for the data bits 108. When the values match, it is verified that the received data bits 108 have probably not been altered during transmission. Again, the receiver may comprise hardware circuits, or a software program.

Figure 2:
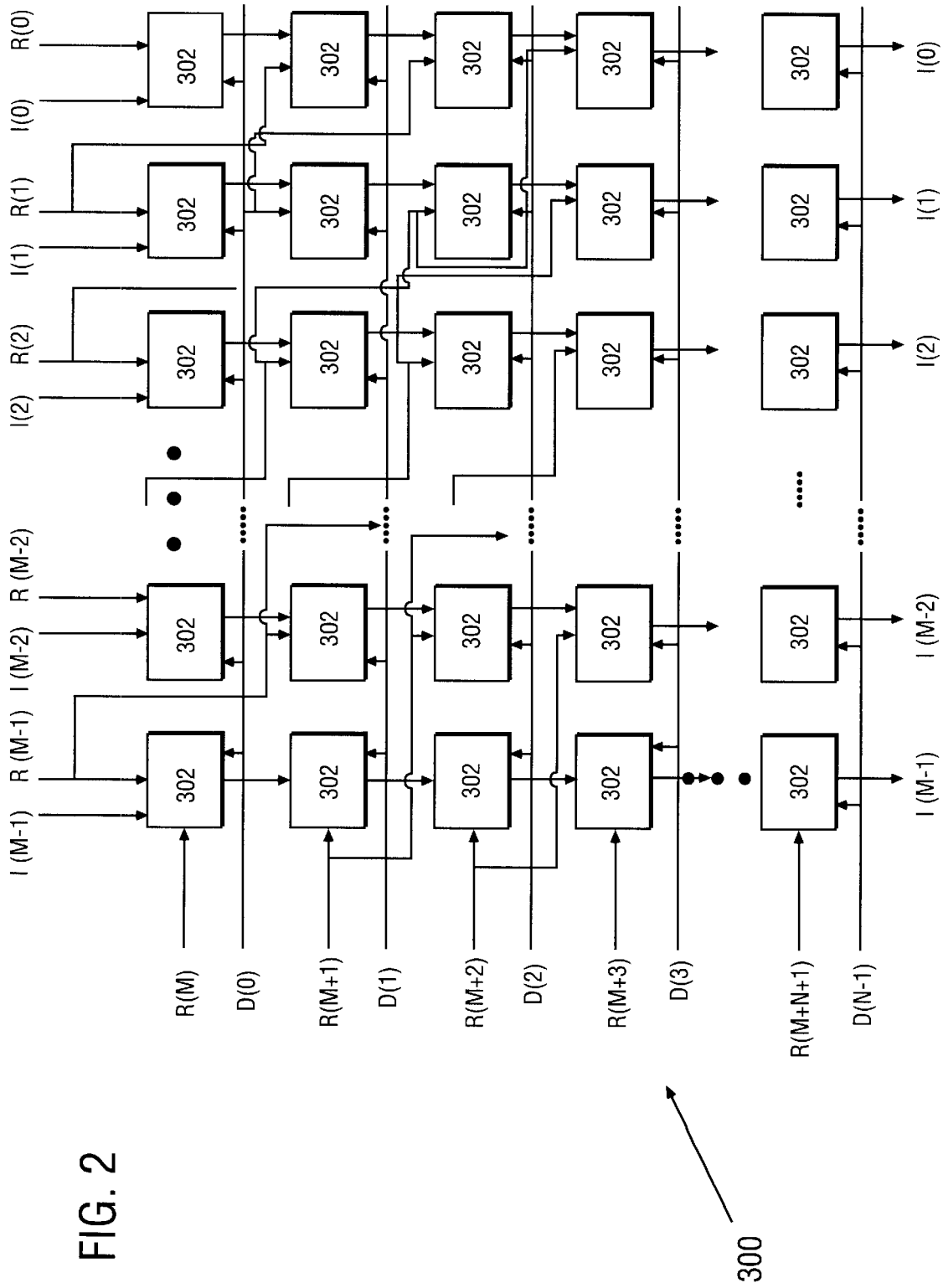
FIG. 2 is a block diagram of one embodiment of a circuit to generate an integrity check value signal in accordance with the present invention.

FIG. 2 is a block diagram of one embodiment 300 of a circuit to generate an integrity check value signal. The operation of the circuit could of course be emulated in software as well. Embodiment 300 comprises an array of circuit elements 302 arranged in a number of columns M, and a number of rows N. Each element 302 in the array may be referred to by its row and column index ij, where i is the number of a particular row ranging from 0 to N−1, and j is the number of a particular column ranging from 0 to M−1. The inputs to an element 302 at position i,j are data bit i, pseudo-random bit j+1, and the output of the element in the preceding row at position i−1, j. Inputs to an element in row zero are data bit 0, pseudo-random bit j+1, and the output bit of the element at position N−1,j. The output bits of the elements at positions N−1,j together comprise the bits of the integrity check value.

In FIG. 2, terminals which receive pseudo-random bits are labeled R and terminals which receive data bits are labeled D. The terminals receiving bits of the integrity check value are labeled I. Circuit 300 produces an integrity check value as follows. For each N data bits to transmit, a set of M+N−2 pseudo-random bits, N data bits, and M−1 integrity check value bits from the prior output of the circuit are presented to the circuit to produce a next M−1 integrity check value bits. This may be referred to as one iteration of the circuit 300.

The integrity check value bits from a prior iteration of the circuit 300 may be stored and fed back into the circuit to produce the integrity check value for a next iteration of the circuit. Thus the integrity check value at the output of the circuit 300 is a product of all data bits which have been presented to the circuit 300 subsequent to the last reset. In other words, the integrity check value which is produced is cumulative over the set of all data bits presented to the circuit since reset. A reset may occur when all inputs to the circuit (data bits, pseudo-random bits, and prior integrity check value bits) are cleared to logical zero.

Note that each row of circuit 300 receives a set of the same pseudo-random bits that are received by other rows of the circuit. In particular, in one embodiment a row of the circuit 300 receives the same set of pseudo-random bits as are received by the immediately preceding row, less one. Thus adding a row to the circuit 300 (to support an additional data bit) requires the addition of only a single additional pseudo-random bit input terminal to the circuit 300. This increases the scalability of the circuit 300 and reduces bandwidth requirements on the pseudo-random bit generator. Of course, the term "rows" is not meant to imply any particular geometric configuration of the circuit elements 302. Rather, the term "rows" is simply a grouping of circuit elements 302 at any particular stage of the circuit 300.

In one embodiment, the set of M+N−2 pseudo-random bits from a prior iteration of the circuit 300 are not completely replaced for a next iteration of the circuit 300. Instead, the pseudo-random bits are shifted left by a number of positions X and X new pseudo-random bits are generated. In other words, $R_{next}(X)=R_{prior}(0)$, $R_{next}(X+1)=R_{prior}(1)$, $R_{next}(X+2)=R_{prior}(2)$ and so on, and next pseudo-random bits 0 . . . X are set with newly generated pseudo-random bits. In this manner the pseudo-random bit generator need generate only X new pseudo-random bits per iteration of the circuit 300, instead of generating M+N−2 new pseudo-random bits. When X is sufficiently large, strong integrity is preserved. Thus lower-bandwidth pseudo-random bit generators may be employed. In one embodiment X is equal to N, the number of data bits processed per iteration of the circuit 300.

In one embodiment the elements 302 are simple, low-latency circuits (see FIG. 3) which can produce output bits I within a single clock cycle of the input of data bits D. Thus the integrity check value comprising bits I may be transmitted almost immediately after the data bits D are transmitted. In other words, the integrity check value is produced with low latency with respect to the data bits. One advantage of low latency is that the transmitter may employ less buffer space because the data bits need not be retained by the transmitter for long before the integrity check value is ready.

Figure 3:
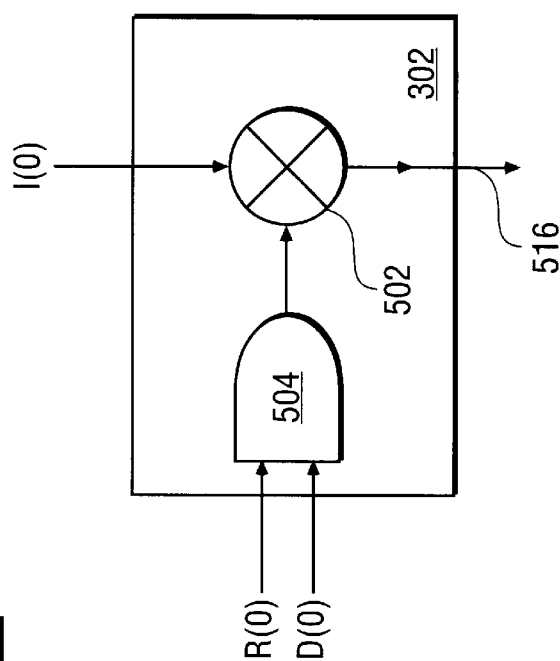
FIG. 3 is a block diagram of one embodiment of an element of the circuit embodiment of FIG. 2.

FIG. 3 is a block diagram of one embodiment of an element at position 0,0 of circuit 300. The element 302 may comprise two logic circuits, AND gate 504 and XOR gate 502. Of course, those skilled in the art will appreciate that other or equivalent logic circuits or combinations of circuits may be employed as well, so long as a combination of the inputs to the element 302 is produced. In this embodiment, element 302 inputs one pseudo-random bit R(0), one data bit D(0), and one integrity check value bit I(0). The integrity check value bit is, in one embodiment, an output signal of a circuit element 302 in the last row of circuit 300. The pseudo-random bit R(0) and the data bit D(0) are combined by AND gate 504 to form an intermediate signal which is supplied to XOR gate 502. XOR gate combines the intermediate signal with the integrity check value bit I(0). As previously described, elements not located in row 0 (the first row) of circuit 300 may not input a prior integrity check value bit, but may instead input a stored form of the output signal of an element 302 in the previous row of the circuit 300.

Of course, in a software embodiment physical circuit elements would not be employed. Instead, logical locations might be assigned to the circuit elements 302. For a particular logical location, sequences of instructions might perform the operation of combining the data bit, pseudo-random bit, and the output bit from a logical location in a prior row. For locations in the first row, the sequences of instructions may combine the data bit, pseudo-random bit, and the integrity bit produced by locations in the last row after a prior iteration. Of course, this is only one possible manner in which software, which is well know to be highly configurable, might carry out the operation of circuit 300.

Figure 5:
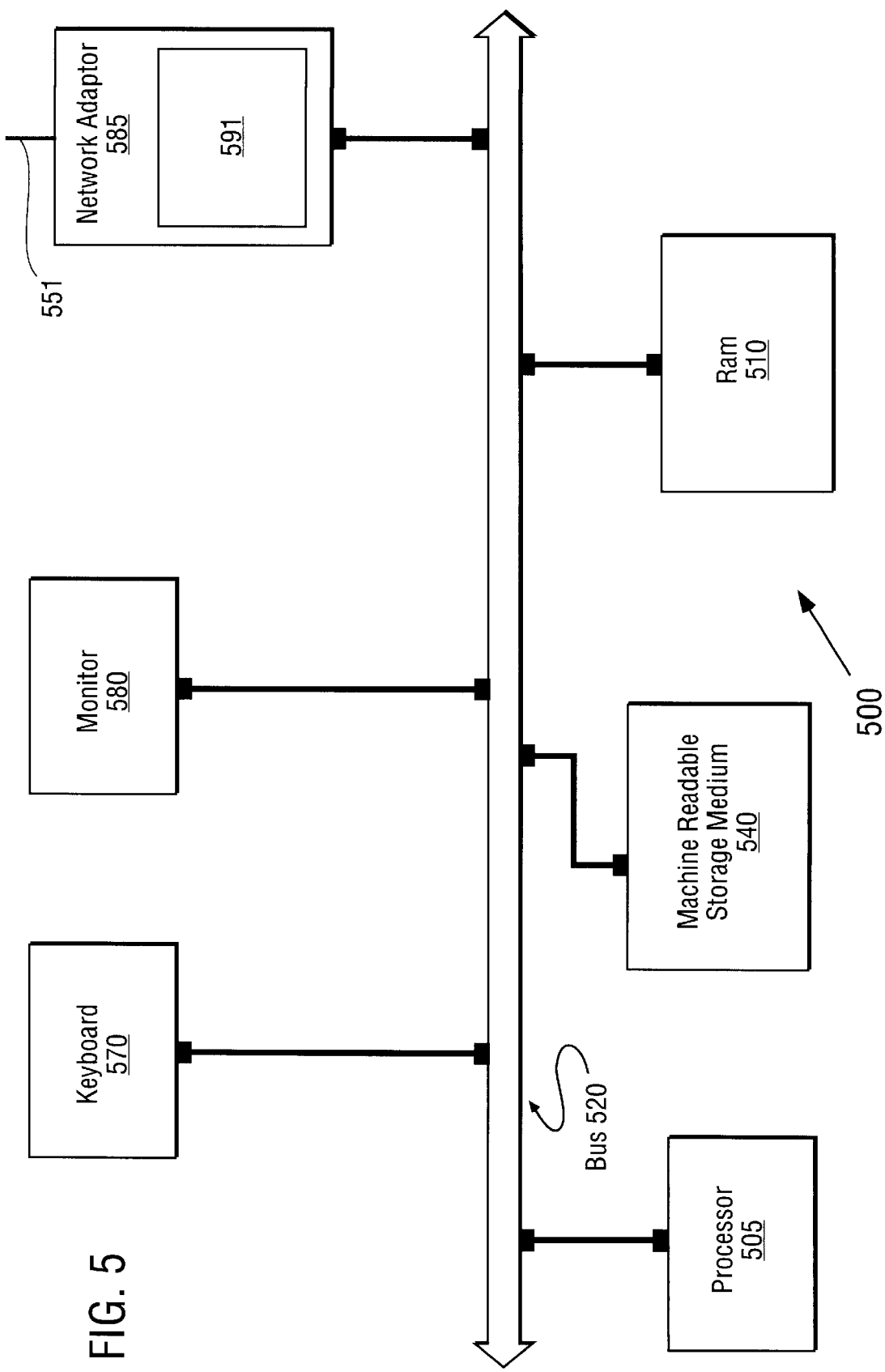
FIG. 5 shows an embodiment of a computer system in accordance with the present invention.

FIG. 5 shows an embodiment 500 of a computer system in accordance with the present invention. Embodiment 500 comprises a processor 505 to execute instructions supplied from a bus 520. The executed instructions are stored in a memory 510 from which they are supplied to the processor 505 by the bus 520 for execution. The processor 505 may be implemented using any semiconductor fabrication technology and may execute any instruction set including, but not limited to, instruction sets supported by an Intel Corporation Pentium® processor or compatible processor. Multiple processors may also be present in the system 500. The bus 520 may be implemented using technologies for propagating signals including, but not limited to, electronic and optical conductors and may in fact comprise multiple busses. The memory 510 may include random access memory (RAM), read-only memory (ROM), or any other form of memory capable of storing instructions which may then be supplied to the processor 505 by the bus 520 for execution. Embodiment 500 may include a machine-readable storage medium 540 to store sequences of instructions which may be loaded into memory 510 from which they may be supplied to processor 505 for execution. The machine-readable storage medium 540 may include, but is not limited to, a hard drive, a floppy drive, and a CD-ROM or other optical disk.

One skilled in the art will appreciate that in "diskless" devices without mass storage mediums, the machine-readable storage medium 540 may be omitted from the embodiment 500. Instructions may then be stored in RAM, ROM, or other memory from which instructions may be directly accessed over the bus 520 by the processor 505 for execution.

To perform signal input/output, embodiment 500 may comprise a keyboard 570 and a display 580, each coupled to the bus 520. Of course, other peripheral devices may be present as well (such as a mouse or other pointing device). The embodiment 500 may further include a network adapter 585 to couple the embodiment 500 to a network by way of an external channel, such as a network cable or wireless link. Of course, the invention is not limited in scope to this particular embodiment.

In accordance with the present invention, the circuit embodiment 591 of FIG. 1 may be included within the network adapter 585. Circuit 591 may be employed to compute an integrity value for data bits transmitted over external channel 55 1, in the manners described previously. Optionally, circuit 591 may also encrypt the data bits to transmit.

While certain features of the invention have been illustrated as described herein, many modifications, substitutions, changes and equivalents will now occur to those skilled in the art. It is, therefore, to be understood that the appended claims are intended to cover all such embodiments and changes as fall within the true spirit of the invention.

What is claimed is:

1. A circuit comprising:

a plurality of data input terminals to receive a plurality of data bits;

a plurality of pseudo-random input terminals to receive a plurality of pseudo-random bits; and a plurality of circuit elements, each circuit element to combine at least one data bit with at least one pseudo-random bit to produce an output signal on an output terminal, the circuit elements configured into a plurality of rows, each row adapted to receive a) at least one data bit of the plurality of data bits;

b) at least one but less than all of the pseudo-random bits received by another row of circuit elements, and c) output signals of circuit elements output by another row.

2. The circuit of claim 1 in which each circuit element logically combines the data bit and pseudo-random bit to produce an intermediate output signal, and each circuit element further logically combines the intermediate output signal and the output signal of a circuit element comprised by the preceding row, to produce the output signal.

3. The circuit of claim 1 further comprising a first row of circuit elements and a last row of circuit elements, the first row of circuit elements adapted to receive the output signals from the last row of circuit elements.

4. A circuit comprising:
 a pseudo-random bit generator to produce a sequence of pseudo-random bits;
 an integrity check signal generator adapted to receive the sequence of pseudo-random bits and a sequence of data bits, the integrity check signal generator to produce an integrity check signal for the data bits, the integrity check signal generator comprising:
  a plurality of data input terminals to receive the sequence of data bits;
  a plurality of pseudo-random input terminals to receive the sequence of pseudo-random bits; and
  a plurality of logic circuits, each logic circuit to combine at least one data bit with at least one pseudo-random bit to produce an output signal on an output terminal, the logic circuits arranged into rows, each row adapted to receive
   a) at least one data bit;
   b) at least one but less than all of the pseudo-random bits received by another row of logic circuits, and
   c) output signals of logic circuits output by another row.

5. The circuit of claim 1 further comprising a first row and a last row of logic circuits, the output signals of the last row comprising the integrity check signal, the first row adapted to receive the output signals of the last row.

6. The circuit of claim 5 in which each logic circuit is adapted to logically combine the data bit and pseudo-random bit to produce an intermediate output signal, each logic circuit further adapted to logically combine the intermediate output signal and the output signal of a logic circuit comprised by another row, to produce the output signal.

7. A method comprising:
 assigning a plurality of data bits and a plurality of pseudo-random bits to a plurality of logical locations, the logical locations organized into rows;
 combining at each logical location at least one data bit with at least one pseudo-random bit to form an output bit;
 receiving, at each row of logical locations,
  a) at least one data bit;
  b) at least one but less than all of the pseudo-random bits combined at another row; and
  c) the output bits from another row.

8. The method of claim 7 further comprising:
 a first row of logical locations receiving the output bits of a last row of logical locations.

9. The method of claim 7 in which each logical location logically combines the data bit and pseudo-random bit to produce an intermediate output bit, and each logical location further combines the intermediate output bit and the output bit of a logical location comprised by another row, to produce the output bit of the each logical location.

10. A computer system comprising:
 a processor;
 a circuit coupled to the processor by way of the bus, the circuit to receive a sequence of data bits from the processor by way of the bus, the circuit comprising:
  a plurality of data input terminals to receive the sequence of data bits;
  a plurality of pseudo-random input terminals to receive a sequence of pseudo-random bits; and
  a plurality of circuit elements, each circuit element to combine at least one data bit with at least one pseudo-random bit to produce an output signal on an output terminal, the circuit elements configured into a plurality of rows, each row adapted to receive
   a) at least one data bit of the plurality of data bits;
   b) at least one but less than all of the pseudo-random bits received by a another row of circuit elements, and
   c) output signals of circuit elements output by another row.

11. The computer system of claim 10 in which each circuit element combines the data bit and pseudo-random bit to produce an intermediate output signal, and each circuit element further combines the intermediate output signal and the output signal of a circuit element comprised by another row, to produce the output signal.

12. The computer system of claim 10 further comprising a first row of circuit elements and a last row of circuit elements, the first row of circuit elements adapted to receive the output signals from the last row of circuit elements.

13. The computer system of claim 10 in which the computer system is a network adapter.

* * * * *